United States Patent [19]

Ellis-Monaghan et al.

[11] Patent Number: 6,096,584
[45] Date of Patent: Aug. 1, 2000

[54] SILICON-ON-INSULATOR AND CMOS-ON-SOI DOUBLE FILM FABRICATION PROCESS WITH A COPLANAR SILICON AND ISOLATION LAYER AND ADDING A SECOND SILICON LAYER ON ONE REGION

[75] Inventors: John J. Ellis-Monaghan, Grand Isle; Steven H. Voldman, South Burlington, both of Vt.

[73] Assignee: International Business Machines Corporation, Armonk, N.Y.

[21] Appl. No.: 09/038,936

[22] Filed: Mar. 12, 1998

Related U.S. Application Data

[62] Division of application No. 08/812,298, Mar. 5, 1997, Pat. No. 5,952,695.

[51] Int. Cl.[7] .................................................. H01L 21/00
[52] U.S. Cl. ........................... 438/151; 438/154; 438/155
[58] Field of Search .................................. 438/151, 154, 438/155, 166, 405, 479

[56] References Cited

U.S. PATENT DOCUMENTS

| | | | |
|---|---|---|---|
| 3,791,024 | 2/1974 | Boleky, III | 438/237 |
| 4,282,556 | 8/1981 | Ipri | 361/56 |
| 4,423,431 | 12/1983 | Sasaki | 257/272 |
| 4,889,829 | 12/1989 | Kawai | 438/405 |
| 4,893,158 | 1/1990 | Mihara et al. | 257/341 |
| 4,963,505 | 10/1990 | Fujii et al. | 438/405 |
| 4,989,057 | 1/1991 | Lu | 257/357 |
| 5,212,397 | 5/1993 | See et al. | 257/347 |
| 5,258,318 | 11/1993 | Buti et al. | 438/154 |
| 5,279,978 | 1/1994 | See et al. | 438/154 |
| 5,294,823 | 3/1994 | Eklund et al. | 257/370 |
| 5,371,401 | 12/1994 | Kurita | 257/524 |
| 5,795,810 | 8/1998 | Houston | 438/404 |
| 5,889,306 | 3/1999 | Christensen | 257/350 |

OTHER PUBLICATIONS

B. Davari, et al., IBM Technical Disclosure; Multiple Thickness Silicon on Insulator Films; vol. 34, No. 6, Nov., 1991; 264–265.

*Primary Examiner*—Charles Bowers
*Assistant Examiner*—William M. Brewster
*Attorney, Agent, or Firm*—Whitham, Curtis & Whitham; Howard J. Walter, Esq.

[57] ABSTRACT

Silicon is formed at selected locations on a silicon-insulator (SOI) substrate during fabrication of selected electronic components, including resistors, capacitors, and diodes. The silicon location is defined using a patterned, removable mask, and the silicon may be applied by deposition or growth and may take the form of polysilicon or crystalline silicon. Electrostatic discharge (ESD) characteristics of the SOI device is significantly improved by having a thick double layer of silicon in selected regions.

10 Claims, 12 Drawing Sheets

NPN STRUCTURE 182

FIG. 11A

PNP STRUCTURE 184

SILICON-ON-INSULATOR AND CMOS-ON-SOI DOUBLE FILM FABRICATION PROCESS WITH A COPLANAR SILICON AND ISOLATION LAYER AND ADDING A SECOND SILICON LAYER ON ONE REGION

CROSS REFERENCE TO RELATED APPLICATION

This application is a divisional of application Ser. No. 08/812,298 filed Mar. 5, 1997, now U.S. Pat. No. 5,952,695.

DESCRIPTION

BACKGROUND OF THE INVENTION

1. Field of the Invention

The present invention generally relates to silicon-on-insulator (SOI) semiconductor devices and, more particularly, to a structure and fabrication process which provides for more robust electrostatic discharge (ESD) protection in SOI devices.

2. Background Description

SOI complimentary metal-oxide semiconductor (CMOS) output buffers do not perform as well as "bulk" CMOS output buffers formed in the silicon substrate for either positive or negative ESD impulses. Given ESD structures are also designed in the silicon layer (e.g., they are made of diodes or SOI metal oxide field effect transistors (MOSFETs)), ESD protection, as a general rule, will not be as good as bulk devices where the heat can be dissipated to the bulk and where the film thickness is greater. In practice, SOI output buffers have been shown to have two times lower ESD robustness when compared to bulk CMOS output buffers.

In general, circuit elements which compose input/output (I/O) circuitry will demonstrate a greater sensitivity to electrical overstress (EOS), ESD, and power-to-failure compared to bulk CMOS technologies when self-heating is involved in the failure mechanism. This consists of the p-channel MOSFETs, n-channel MOSFETs, buried resistor elements, decoupling capacitors, diodes, parasitic bipolar elements, and any other features used in CMOS-on-SOI, and SOI (including silicon-on-sapphire (SOS)).

In SOI, certain ESD concepts will not work. For example, thick field oxide ESD structures are impractical. In bulk CMOS, the p+ source/drain implants, p+, n+, and well structures are used as diode elements for ESD networks. In bulk CMOS, these can be formed without the presence of the polysilicon gate structure. Standard ESD networks, such as "double-diode networks," are constructed of p+ diffusions in well tubs, and n+/n-well elements in the bulk substrate. Parasitic npn and pnp transistors are also utilized to create pnpn silicon controlled rectifiers. In thin film SOI, these structures are not constructable or available to form standard diodes, pnp transistors, npn transistors, pnpn or thick oxide elements. As SOI technologies are scaled, the film thickness above the insulating layer will decrease, hence ESD robustness will decrease with continued scaling of the SOI technology (see, Chan et al., IRPS, 1994).

It has been proposed that ESD performance can be improved by designing drivers and diode-based ESD structures in bulk silicon, (see, Chan et al., ibid.). This approach has many drawbacks. First, these structures must be built below the buried oxide layer, and this creates difficulties in terms of increased processing steps, bulk wafer contamination, and gettering concerns. Second, the fabricated device has a significantly different characteristic on input/output (I/O). Third, a non-planar structure results. Fourth, this approach negates the advantages of SOI where there is no interaction with the bulk substrate, wafer contamination is avoided, and other gettering concerns are alleviated.

As indicated above, in bulk CMOS, the p+ source/drain implants, p+, n+, and well structures are used as diode elements for ESD networks. In SOI, a diode can be created between the source/drain implants and the MOSFET body. The active area of the diode in fully depleted SOI will be the width of the diode times the film thickness. The junction area that abuts the oxide film will not be utilized in supplying diode current. As a result, creating a low resistance diode of significantly small perimeter is not practical in very thin film SOI technologies. ESD robustness and the effectiveness of a diode as an ESD network is a function of the diode series resistance. As the diode series resistance increases, the ESD robustness and effectiveness decreases. To utilize the standard scaled SOI diode as an ESD element is compromised as the film thicknesses is scaled.

In general, in SOI, a good diode element is unavailable. Non-SOI CMOS circuitry makes use of the diode element for temperature reference and phased locked loop (PLL) circuitry. An alternate solution of creating a diode by implanting the N and P dopants at opposite ends of a gate poses the difficulty that the diode characteristics will be influenced by the thickness of the active silicon layer, by the quality of the front and back gate oxides, and by the leakage characteristics of the structure.

U.S. Pat. No. 5,258,318 to Buti discloses a method of forming an SOI BiCMOS integrated circuit on a planar structure wherein the CMOS devices are formed in a thin epitaxial layer and the bipolar devices are formed in a thick epitaxial layer. Buti does not teach or suggest the formation of ESD protect circuits on the thick epitaxial layer.

U.S. Pat. No. 5,294,823 to Eklund discloses a method of forming an SOI BiCMOS circuit on a non-planar structure whereby the CMOS transistors are formed in the first, thin epitaxial layer and the bipolar transistors are formed on the composite epitaxial depositions. Eklund does not show forming ESD protect circuits in the composite epitaxial layer.

U.S. Pat. No. 4,989,057 to Lu describes a conventional n-channel SOI transistor for use as an ESD protect circuit.

Davari et al., in IBM Technical Disclosure Bulletin, Vol. 34, No.6, pp.264–5, November, 1991, discloses a method of forming a planar structure with multiple thicknesses of silicon-on-insulator for fabrication of CMOS and lateral bipolar structures.

U.S. Pat. No. 4,423,431 to Sasaki discloses an ESD device on bulk silicon or SOI wherein the ESD circuit includes an aluminum electrode on top of the PSG dielectric which integrates with the standard MOS processing. Sasaki also shows the use of a thick gate insulating layer and eliminating the standard gate electrode.

SUMMARY OF THE INVENTION

It is an object of this invention to provide structures and methods for improved ESD robustness in SOI, SOS, and CMOS-on-SOI, for circuit elements which include thick silicon films for analog function and in the external I/O and ESD device sectors of a semiconductor integrated chip.

It is another object of this invention to provide elements such as diodes, bipolar transistors, wells, MOSFETs, resistors, buried resistors, and capacitor structures used for I/O circuitry, drivers and receivers as well as ESD networks which include thicker silicon films to provide a higher power-to-failure threshold, EOS and ESD robustness.

It is yet another object of this invention to provide a structure and method for improved ESD protection in SOI and SOS which includes thicker silicon or polysilicon at the ESD device location.

According to the invention, a double layer, including a second layer of either grown silicon or deposited polysilicon, is formed on regions of interest only in a SOI or SOS circuit elements (electronic devices) which require higher power-to-failure or ESD robustness, or where self-heating is desired to be limited. ESD robustness improves with increasing film thickness and increased diode area, and by selectively increasing the film thickness in selected areas with a second silicon or polysilicon layer the SOI or SOS device has improved ESD protection. A mask can be used either prior to or subsequent to gate definition to define the area for polysilicon or grown silicon. Polysilicon is deposited or silicon is grown at regions where the diode structure is advantageous for ESD, analog or digital circuitry, or other reasons, and is completed between the isolation definition and gate definition sectors of an SOI or SOS process. The process of double layer formation can be incorporated into established SOI processes, such as SIMOX with trench isolation or MESA isolation, and adds the step of providing the polysilicon film or growing the silicon layer over any chip region where it will be advantageous.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF THE PREFERRED EMBODIMENTS OF THE INVENTION

Figure 1A:
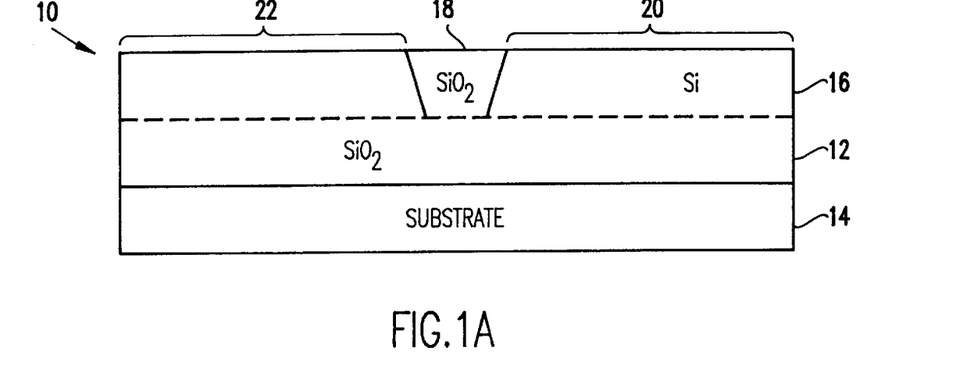
FIGS. 1a–1h are sequential cross-sectional views of process steps according to this invention for producing a double layer SOI or SOS device.

FIGS. 1a–h illustrate one embodiment of a fabrication process according to this invention. Starting with a substrate such as wafer 10 having a buried oxide layer 12 separating bulk substrate 14 and a surface silicon film 16, a dielectric isolation 18, such as a trench isolation or a MESA isolation, is formed on the buried oxide layer 12 to separate regions 20 and 22. The wafer 10 is representative of starting materials for SOI and SOS devices well known in the art, and the isolation structure 18 can be created by any of a number of wellknown techniques and serves the purpose of providing isolated structures 20 and 22 on the wafer 10. FIG. 1a shows only structures 20 and 22 for illustrative purposes, and it should be understood by those of skill in the art that the wafer 10 will have several isolated structures 20 and 22 on its surface, each being separated by dielectric isolation 18.

Figure 1B:
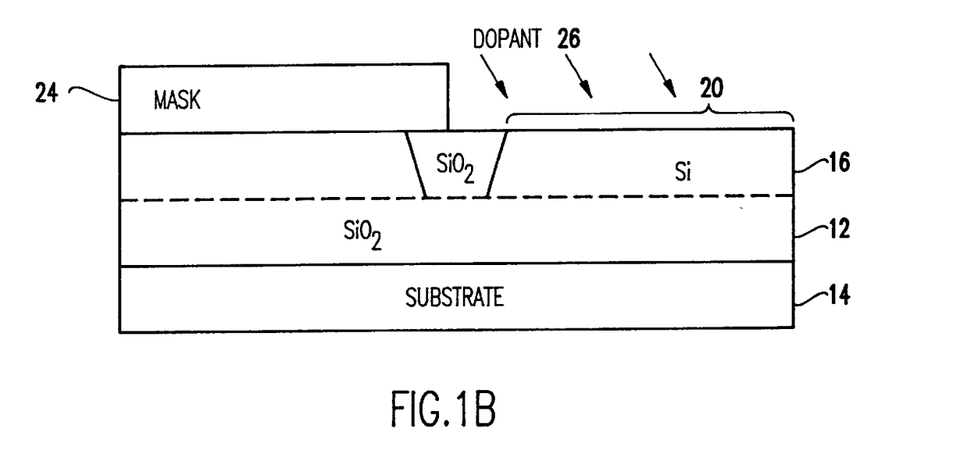

Well implants (N and P) are then completed as needed by the SOI or SOS device. FIG. 1b shows a patterned mask 24, which could be a photoresist material patterned using conventional lithography procedures or any other suitable material, positioned on top of substrate 10 with an opening which exposes region 20 to dopant 26. For an N implant in region 20, the preferred dopant is phosphorus. For a P implant in region 20, the preferred dopant is boron. Suitable masking materials include photoresists, polysilicons, nitrides, and other known materials used in the semiconductor industry.

The next step in the process is to add silicon or polysilicon to desired locations on the wafer 10. The extra silicon which is added is the main focus of this invention. The double layer of silicon on the SOI and SOS structure provides for many device features. For MOSFETs, it allows for deeper junctions and a lower body series resistance. This will provide a more ESD robust transistor structure. For decoupling capacitors, it provides a lower electrode series resistance as well as an ESD robust electronic switch MOSFET. For diode and bipolar based ESD networks, it allows usage of the diode area, emitter-base and base-collector junction area.

Figure 1C:
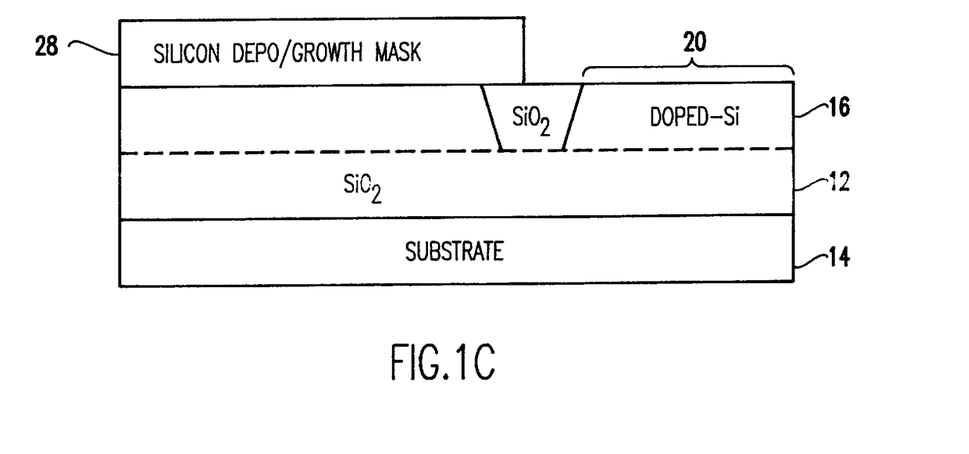
Figure 1D:
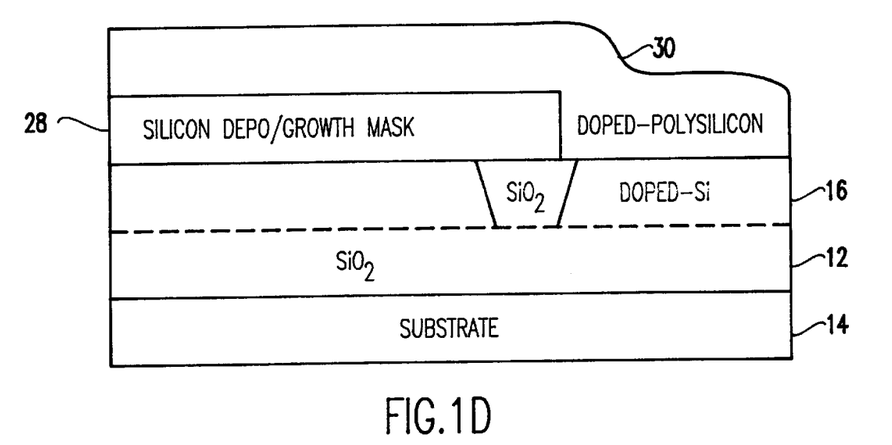
Figure 1E:
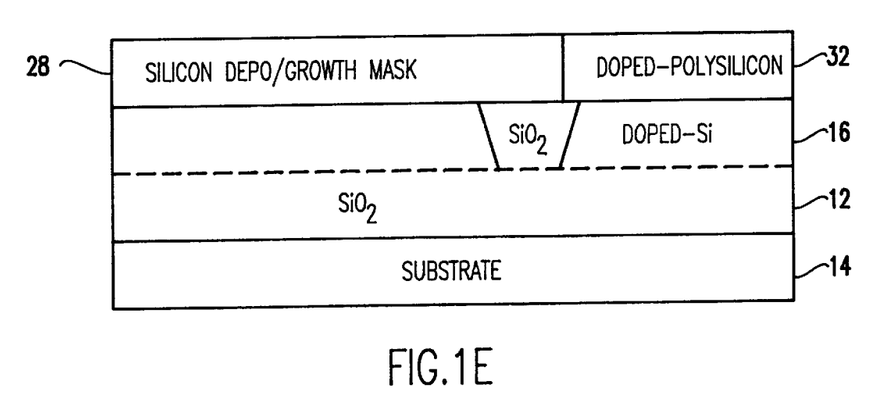
Figure 1F:
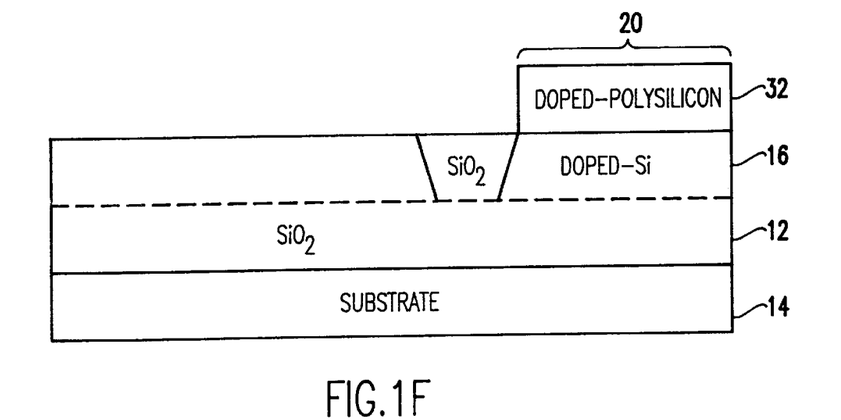

FIG. 1c shows substituting a silicon deposition/growth mask 28 for the patterned mask 24 used for implant purposes (see FIG. 1b). This can be accomplished by stripping the patterned mask 24 from the wafer 10, and then applying and patterning a layer of mask material such that selected regions, such as region 20, are open for deposition or growth of silicon or polysilicon. The preferred masking material for silicon deposition/growth mask is preferably nitride or oxide, however, other materials may also be used. It may also be possible in some applications to use the same masking material for implantation (mask 24) and silicon deposition/growth (mask 28). FIGS. 1d–f show that a patterned double layer of silicon is created in region 20 of the wafer 10 by depositing a layer of polysilicon 30 over the wafer 10, planarizing the polysilicon 30, and removing the silicon deposition/growth mask 28, respectively. The polysilicon 30 can be deposited, or grown, using a variety of conventional techniques, and forms a conformal layer over the wafer 10. Due to the pattern created by the silicon deposition/growth mask 28, the polysilicon only forms a second layer 32 at desired locations on the wafer. Planarizing can be accomplished using chemical-mechanical polishing, etching, or other suitable techniques, and the silicon deposition/growth mask can be stripped, or otherwise removed, from the wafer 10 using a solvent to leave the polysilicon 30 second layer 32 at region 20. Due to the implanting step, the polysilicon 30 retains the doped characteristics of the underlying silicon in region 20.

Figure 2:
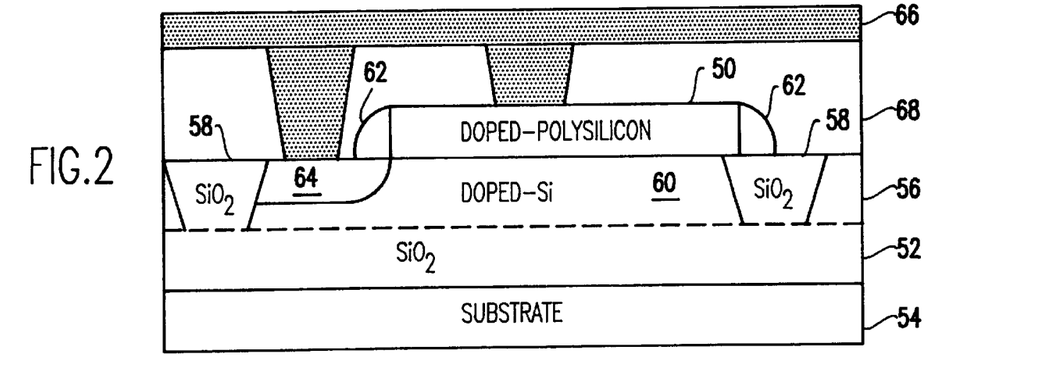
FIG. 2 is a cross-sectional view of a diode structure produced according to the present invention.

It should be understood that the silicon or polysilicon can be deposited at locations other than region 20. This example provides a second layer 32 of polysilicon 30 at region 20, and is useful for making a diode structure for ESD protection. FIG. 2 shows a completed diode structure. However, as will be discussed below in connection with FIGS. 3 and 4, the polysilicon 30 can be deposited over isolation regions when resistors and capacitors or other devices are formed.

Figure 1G:
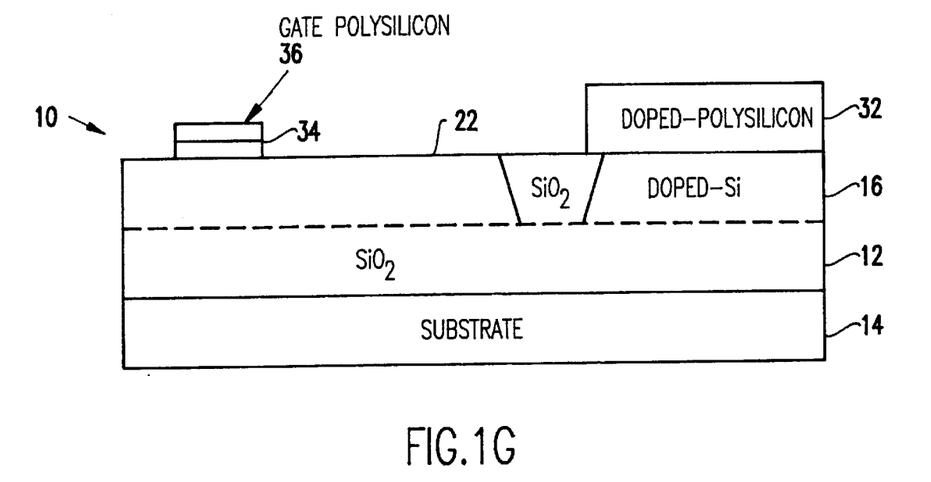
Figure 1H:
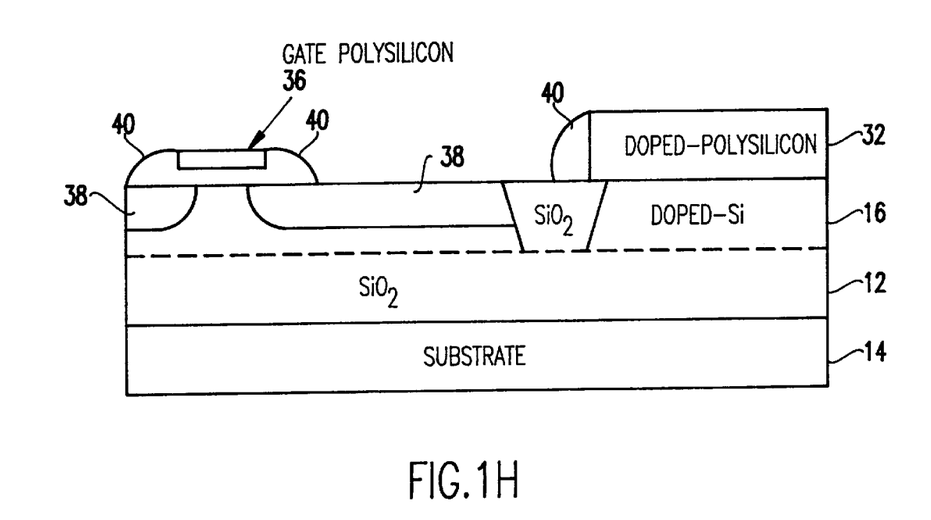

The remaining steps are conventional and, for example, can be used to create an SOI or SOS transistor on region 22 of wafer 10. FIGS. 1g–h show that this is accomplished by patterning an insulator layer 34 on region 22 and forming a conductive pattern 36 such as gate polysilicon on the insulator. N+/P+ source/drain implants 38 are created in region 22 and are positioned on either side of the insulator layer 34, by patterning and dopant bombardment in a manner similar to that described in FIG. 1b. It is preferred that the N+/P+ source/drain implants be arsenic (As) or phosphorus for n-type MOSFETs, and boron for p-type MOSFETs. Sidewall insulation 40, which can be oxide or any other isolation process/structure, is formed on the sides of the doped polysilicon layer 32 and the gate 36 by standard processing techniques for the purpose of structural isolation.

Figure 3:
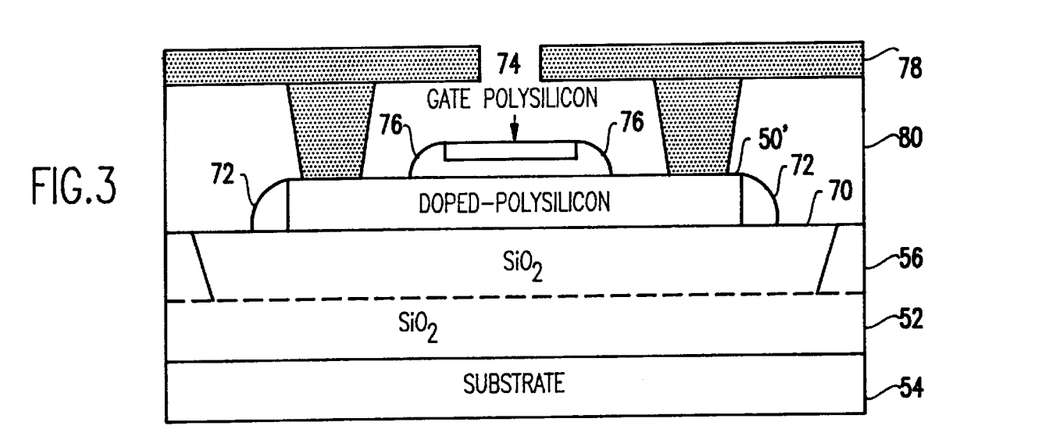
FIG. 3 is a cross-sectional view of a resistor structure produced according to the present invention.
Figure 4:
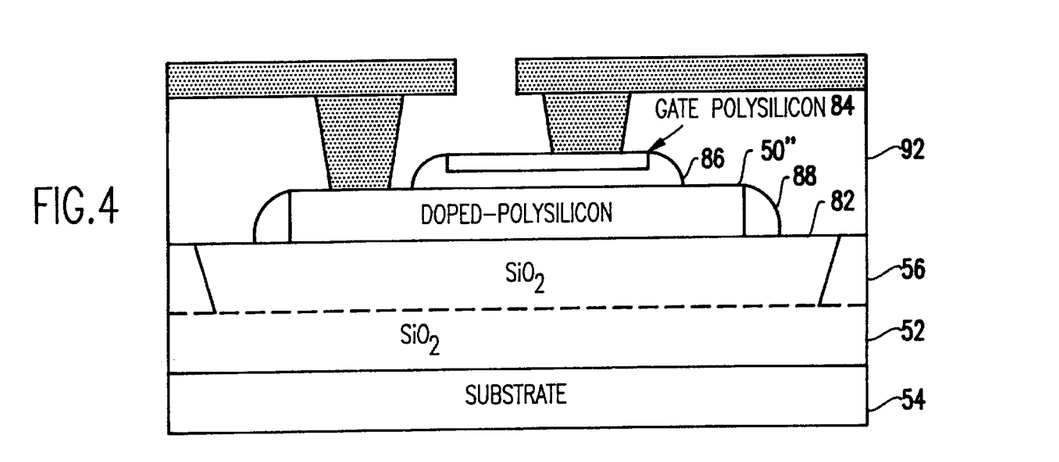
FIG. 4 is a cross-sectional view of a capacitor structure produced according to the present invention.

FIGS. 2–4 show examples of SOI or SOS diode, resistor, and capacitor devices, respectively, formed according to the present invention. In each structure, a second layer of polysilicon 50, 50' and 50" is selectively deposited on specific regions on the wafer surface. As discussed above, the wafer has a buried oxide layer 52 separating bulk substrate 54 from an upper silicon surface layer 56, and can be either and SOI or SOS device.

FIG. 2 shows isolation regions 58 separating region 60 from other regions in the upper silicon surface layer 56. As described in conjunction with FIG. 1b, region 60 of the diode structure in FIG. 2 is doped with an N or P dopant. The second layer of polysilicon 50 is positioned to partly cover the underlying silicon in region 60, and includes sidewall insulating spacers 62. An implant in sub-region 64 of region 60 is doped with a dopant of opposite polarity to doped polysilicon 50. The implant in sub-region 64 can be created in a manner similar to that described in conjunction with the gate structure of FIGS. 1g–h using masking and ion bombardment techniques. A conductive interconnect material 66, such as metal or polysilicon, electrically connects the doped polysilicon 50 to the doped silicon of opposite polarity creating polysilicon to silicon diode. The conductive material 66 can be created by overcoating the substrate with dielectric 68, such as oxide, forming vias to the doped polysilicon 50 and the oppositely doped silicon in sub-region 64, and filling the vias with a layer of the conductive material 66. Alternatively, the conductive material 66 can take the form of metallurgical contacts which extend to the doped polysilicon 60 and oppositely doped silicon in sub-region 64. The with or without a body contact.

FIG. 3 shows a resistor structure wherein the second layer of doped polysilicon 50' is selectively formed over an insulator trench 70 formed in the upper silicon surface layer 56, and which extends to the buried oxide layer 52. In this embodiment, the doped polysilicon 50' is placed over the dielectric in insulator trench 70 to create a thin film resistor structure. As discussed above, sidewall insulation 72 can be created adjacent the doped polysilicon 50' by standard processing techniques for the purpose of structural isolation. A gate structure is created on the polysilicon 50' in a manner similar to that described above in conjunction with FIGS. 1g–h, such as, for example, by applying a patterned insulator layer and patterned gate polysilicon 74 at a desired location on polysilicon 50', and subsequently forming sidewall insulation 76 and 72 on the sides of the gate polysilicon 74 and surface polysilicon 50'. To complete the resistor structure, contact is made to the surface polysilicon 50' on opposite sides of the gate polysilicon 74 using a conductive interconnect material 78. As described above in conjunction with FIG. 2, the conductive interconnect material 78 can be formed over an overcoating insulation material 80 patterned with vias that extend to the polysilicon 50' on opposite sides of the gate 74, or can take the form of metallurgical contacts that are joined to the polysilicon 50' on opposite sides of the gate 74. The structure can be completed with or without a body contact.

FIG. 4 shows a capacitor structure which, like the resistor structure of FIG. 3, has the second layer of doped polysilicon 50" selectively formed over an insulator trench 82 formed in the upper silicon surface layer 56, and which extends to the buried oxide layer 52. In addition, like FIG. 3, FIG. 4 shows a gate structure formed on the doped polysilicon 50" such as, for example, by applying a patterned insulator layer and patterned gate polysilicon 84 at a desired location on polysilicon 50", and subsequently forming sidewall insulation 86 and 88 on the sides of the gate polysilicon 84 and surface polysilicon 50". Contrasting FIGS. 3 and 4, it can be seen in FIG. 4 that the conductive interconnect 90 is joined to the gate polysilicon and the doped polysilicon 50" to create the thin film capacitor structure. As before, the conductive interconnect 90 can be metal or polysilicon or any other conductive material, and may be formed through vias in an overcoating dielectric layer 92, or be made as direct metallic contacts to the gate polysilicon 84 and doped polysilicon 50".

Figure 5A:
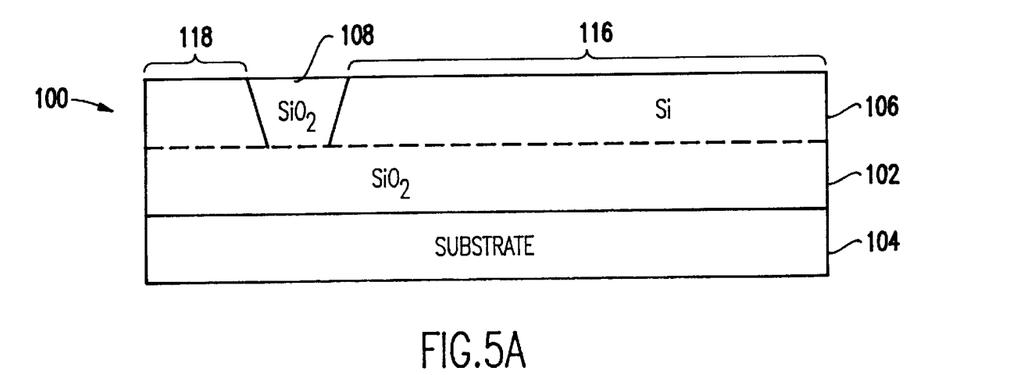
FIGS. 5a–5j are sequential cross-sectional views of an alternative process according to this invention for producing a double layer SOI or SOS device.
Figure 5B:
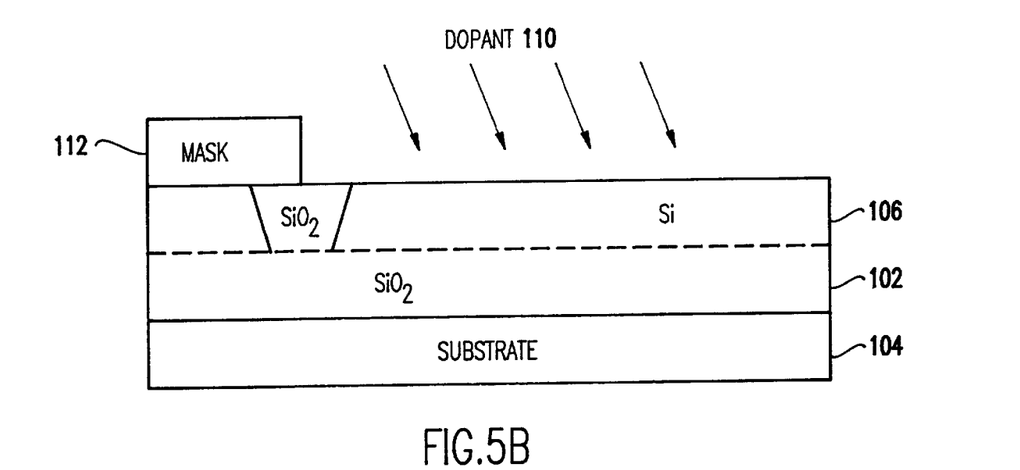
Figure 5C:
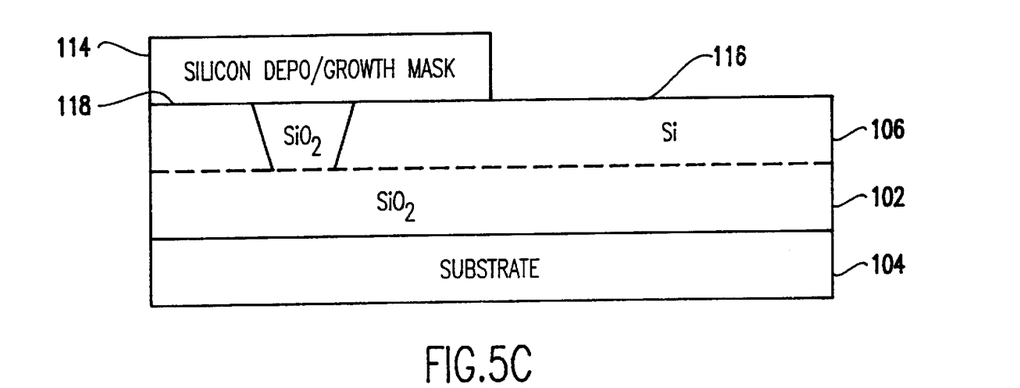

FIGS. 5a–j show an alternative embodiment to the fabrication methodology shown in FIGS. 1a–h. As discussed above, and SOI or SOS device is formed on a wafer 100 having a buried oxide layer 102 separating bulk silicon 104 from an upper silicon layer 106. The upper silicon layer 106 is divided into distinct regions by dielectric insulation 108 which can be in the form of a trench isolation or MESA isolation which extends to the buried oxide layer 102. As was discussed in conjunction with FIGS. 3 and 4, the dielectric insulation 108 can be made large enough to support the thin film resistor and capacitor structures. Regions of the upper silicon layer 106 can be implanted with N or P dopant 110, using a patterned mask 112. The mask 112 is removed and replaced with a silicon deposition growth mask 114 patterned as required for the application. In FIG. 5c, the silicon deposition/growth mask 114 extends over region 118 and a portion of region 116 to facilitate the fabrication of transistors in both regions; however, as can be seen from FIGS. 2–4 the mask 114 would be patterned to accommodate the fabrication of any desired component.

Figure 5D:
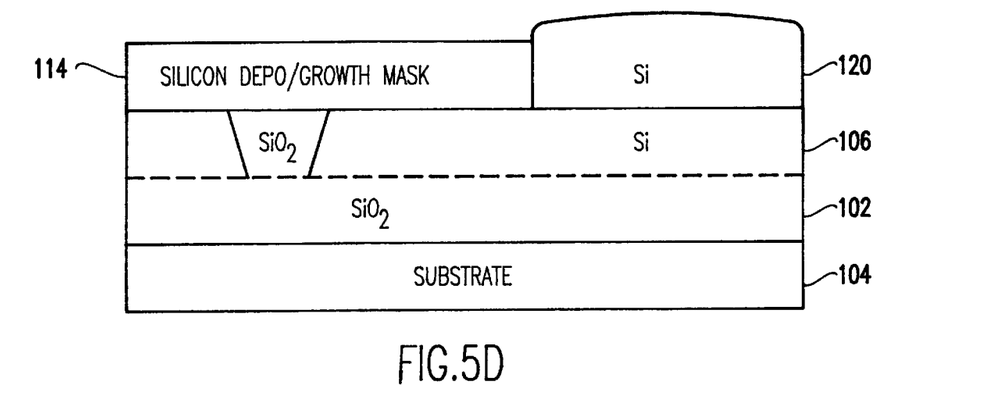

FIG. 5d illustrates the principal difference between the fabrication process of FIGS. 1a–h and FIGS. 5a–j. Specifically, after mask 114 is patterned, a second layer of silicon 120 is grown or deposited on the wafer 100 in the openings in the mask 114; rather, than overcoating the mask with a polysilicon layer as is shown in FIG. 1d. Silicon 120 can be grown or deposited on the wafer by a variety of methods, and the preferred methodology is to use selective silicon deposition.

Figure 5E:
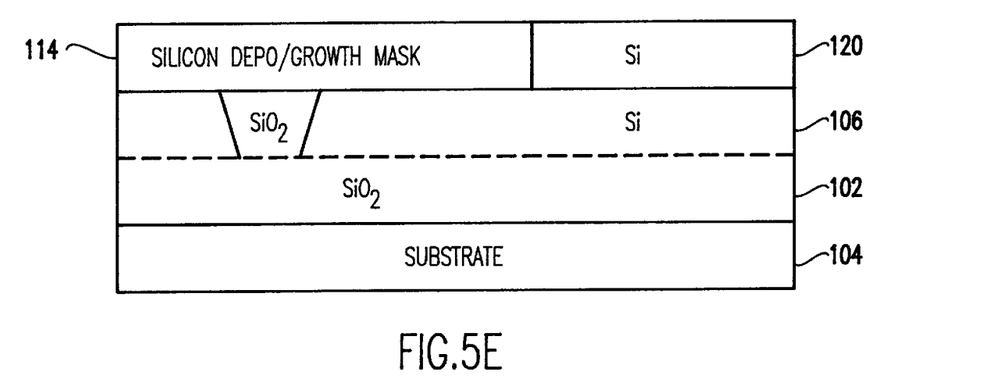
Figure 5F:
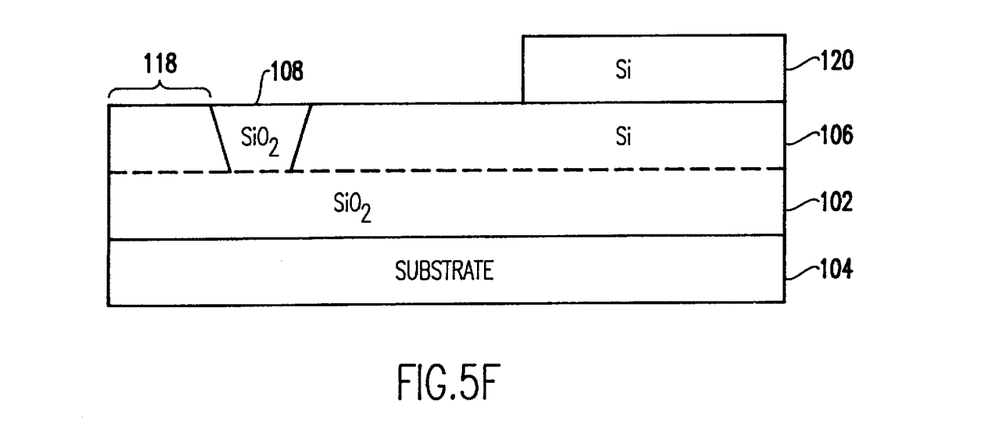

FIGS. 5e and 5f show that the silicon 120 is planarized by chemical-mechanical polishing, etching, or by other suitable procedures, and the silicon deposition/growth mask 114 is removed by stripping with solvent or other suitable means.

Figure 5G:
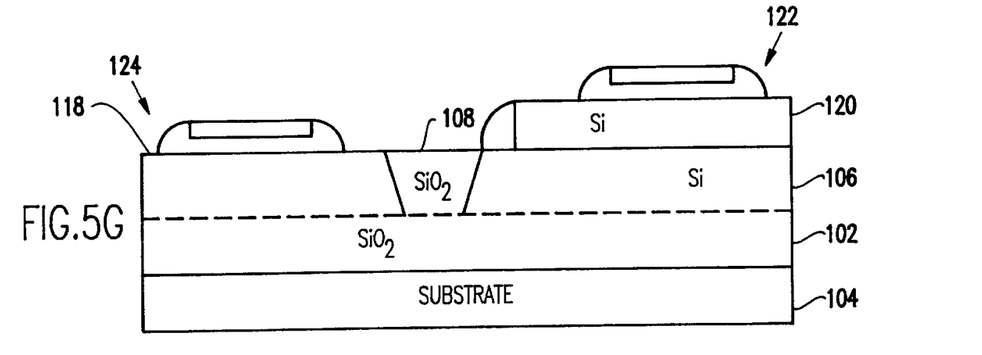
Figure 5H:
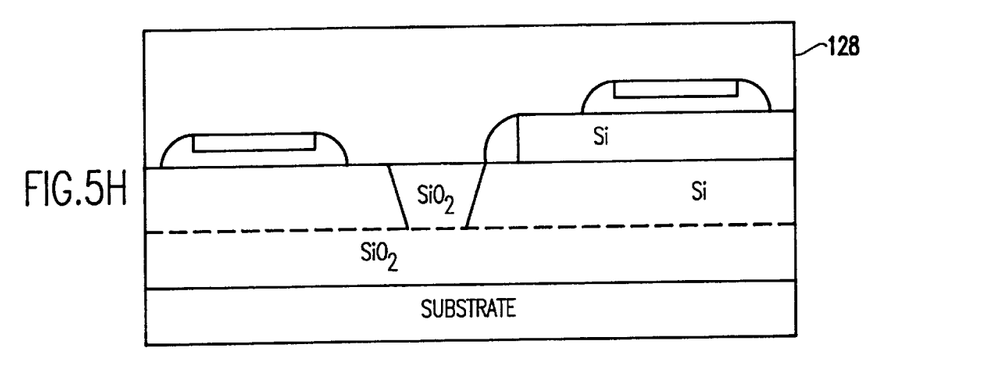
Figure 5I:
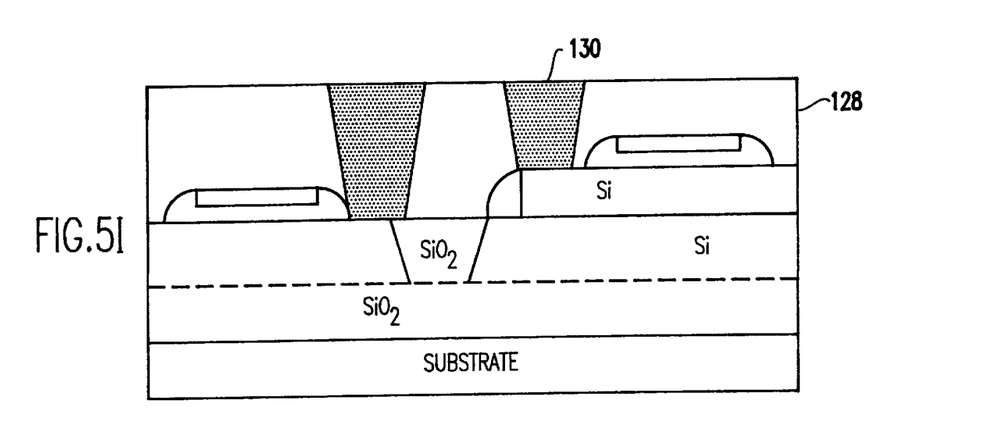
Figure 5J:
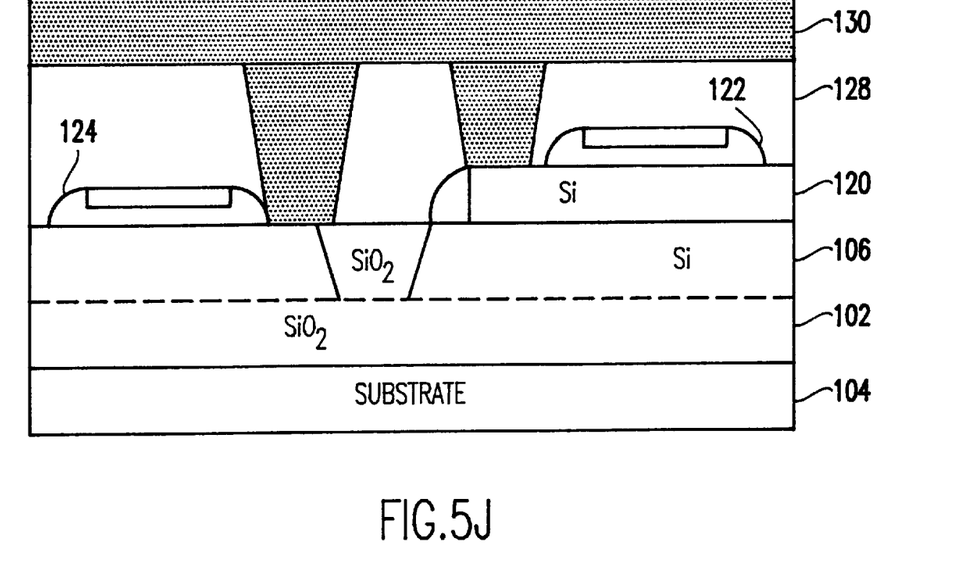

FIG. 5g shows that gate structures 122 and 124 are created on the second thickness silicon 120 and region 118 of silicon layer 106, respectively. These structures 122 and 124 can be created simultaneously by applying a gate oxide over the wafer 100, patterning, forming a conductor on the pattern, and forming sidewall insulation, similar to the procedures described in conjunction with FIGS. 1g–h. FIGS. 5h–j show that the two transistor structure is completed by overcoating the wafer 100 with a dielectric 126, forming vias which extend to the second thickness silicon 120 and the silicon in region 118, and adding a conductive material, such as polysilicon or metal, to fill the vias and interconnect the structures. Direct metallization connections might also be employed. As discussed in conjunction with FIGS. 2–4, a variety of different structures can be formed according to this procedure including capacitors, diodes, and resistors.

Figure 6:
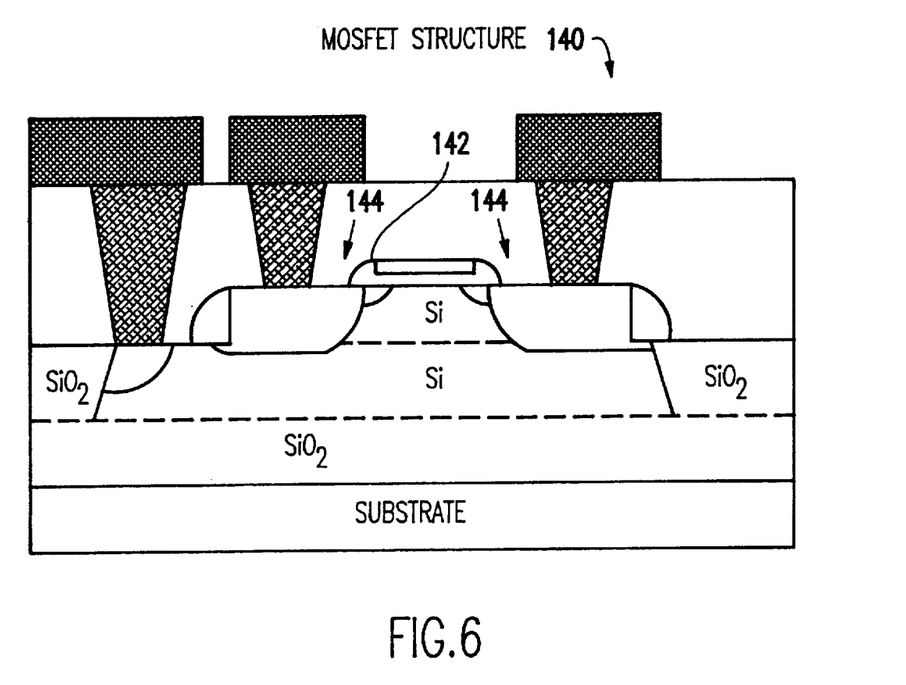
FIG. 6 is a cross-sectional view of a MOSFET structure produced according to the present invention.

FIG. 6 shows a MOSFET structure 140 formed in a dual film silicon section according to the inventive process. The MOSFET includes a gate structure 142 comprised of a polysilicon film, a thin dielectric, and spacers. The source/drain implants 144 include an Ldd and extension implants. For the MOSFET 140, the dopant of the source and drain is of the same polarity and the body of the MOSFET transistor is of the opposite polarity. The Ldd implant extends under the spacer structure. The extension implant junction depth can remain in the first silicon film, or extend into the second film, or extend to the buried oxide film. Allowing for deep extension implants allows for a lower MOSFET source/drain series resistance which is an advantage over thin film SOI processes for advanced CMOS-on-SOI. The power-to-failure of the structure improves as a result of the larger physical volume where self heating can occur.

"Note: The MOSFET structure can be used as a lateral bipolar transistor as well as by using the body contact as the base and source/drain as emitter and collector."

Figure 7:
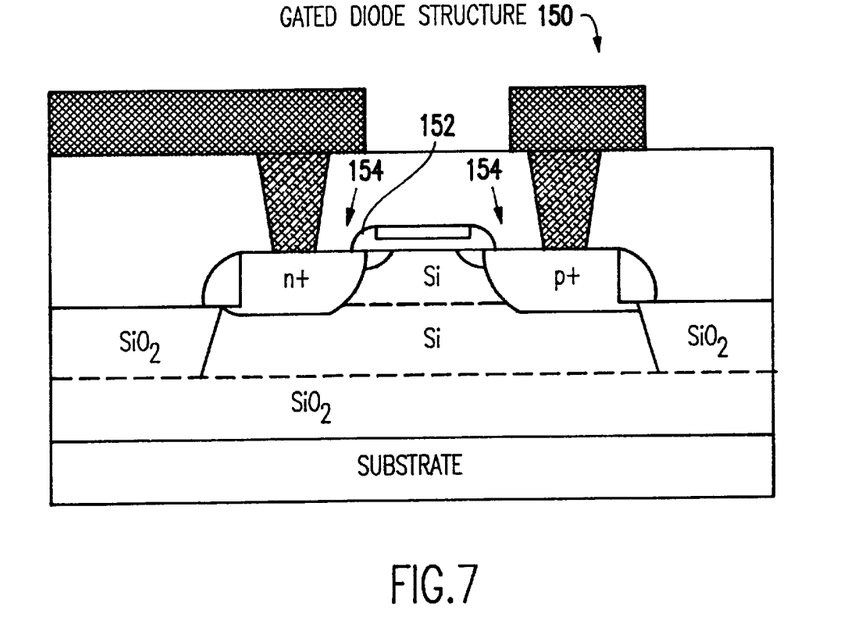
FIG. 7 is a cross-sectional view of a gated diode or Lubistor structure produced according to the present invention.

FIG. 7 shows a gated diode 150 constructed of a MOSFET structure formed in a dual film silicon section. The gated diode 150 includes a gate structure 152 comprised of a polysilicon film, a thin dielectric, and spacers. The source/drain implants 154 consist of a Ldd and extension implants. For the gated diode 150, the dopant of the source and drain is of the opposite polarity and the body of the MOSFET transistor is of the same polarity of the anode or cathode of the diode structure. The Ldd implant extends under the spacer structure. The extension implant junction depth can remain in the first silicon film, or extend into the second film or extend to the buried oxide film. Allowing for deep extension implants allows for a lower diode series resistance which is an advantage over thin film SOI processes for advanced CMOS-n-SOI. When the diode implant only extends to the first or second film, the area of the implant contributes to the diode current as well as the edge of the implant. The power-to-failure of the structure improves as a result of the larger physical volume where self-heating can occur.

Figure 8:
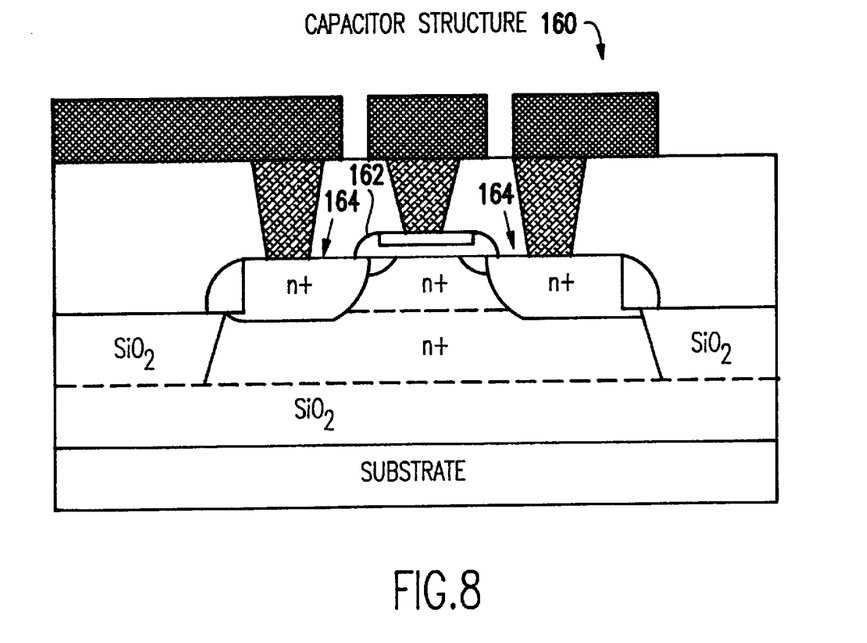
FIG. 8 is a cross-sectional view of a capacitor structure produced according to the present invention.

FIG. 8 shows a capacitor structure 160 formed in a dual film silicon section according to this invention. The capacitor includes a gate structure 162 comprised of a polysilicon film, a thin dielectric, and spacers. The source/drain implants 164 include an Ldd and extension implants. For the capacitor 160, the dopant of the source and drain is of the same polarity, and the body of the MOSFET transistor is also of the same polarity. The Ldd implant extends under the spacer structure. The extension implant junction depth can remain in the first silicon film, or extend into the second film, or extend to the buried oxide film. Allowing for deep extension implants allows for a lower capacitor series resistance which is an advantage over thin film SOI processes for advanced CMOS-on-SOI. The power-to-failure of the structure improves as a result of the larger physical volume where self heating can occur.

Today, in CMOS-on-SOI, the resistance in series with the capacitor plate limits the usage of this structure as a decoupling capacitor for SOI applications. The capacitor design shown in FIG. 8 offers the advantages that it can be used as a decoupling capacitor on I/O circuitry, and that it can be placed in series with an electronic switch. The electronic switch can also use a dual film SOI MOSFET for added ESD robustness.

Figure 9:
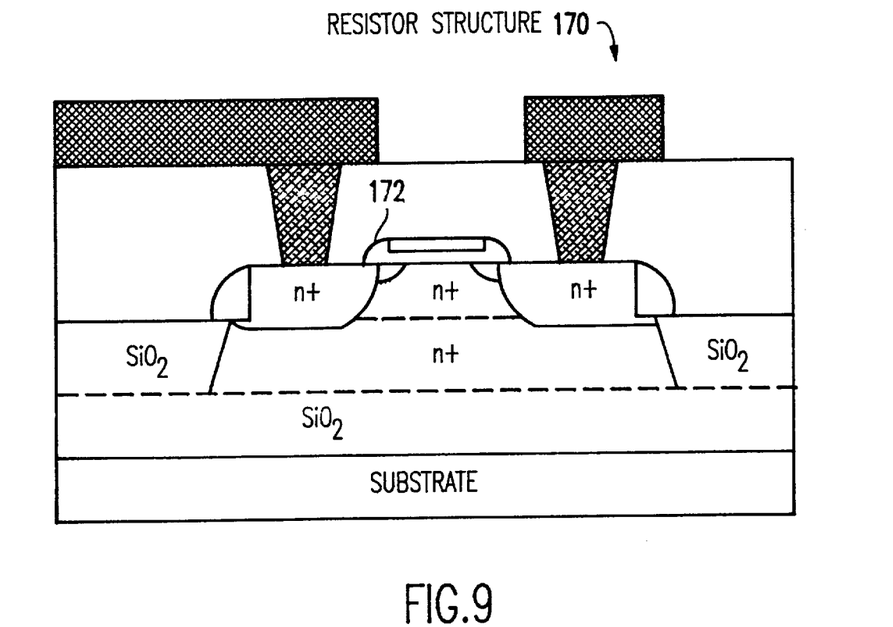
FIG. 9 is a cross-sectional view of a resistor structure produced according to the present invention.

FIG. 9 shows a resistor element 170 in a dual silicon film. For the resistor 170, the dopant of the source and drain anode is of the same polarity as the implant under the gate 172 and/or body. The implanted region under the gate structure 172 can be the same or opposite polarity. The resistor 170 can remain in the first silicon film, or extend into the second silicon film.

Figure 10:
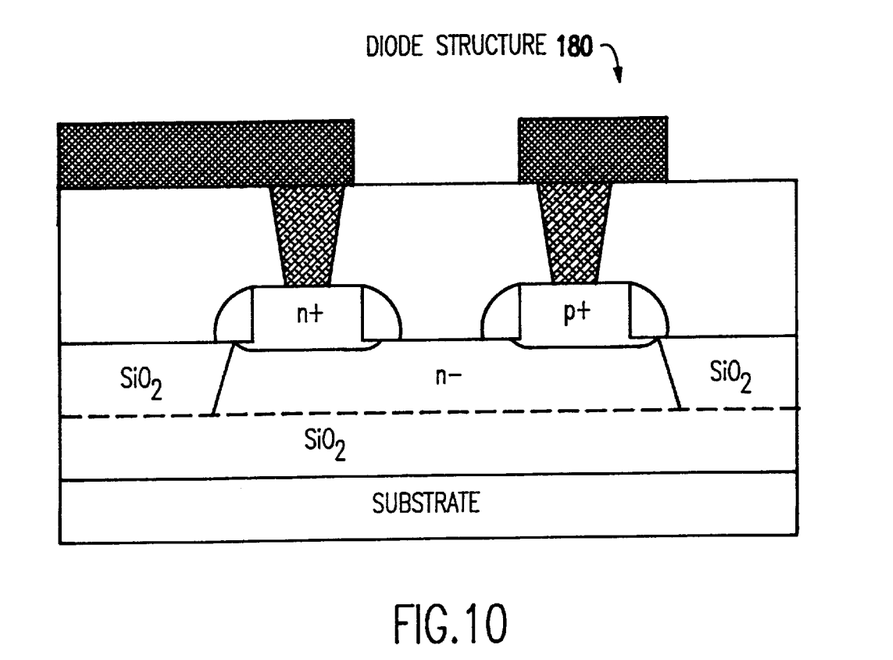
FIG. 10 is a cross-sectional view of a diode structure produced according to the present invention.
Figure 11A:
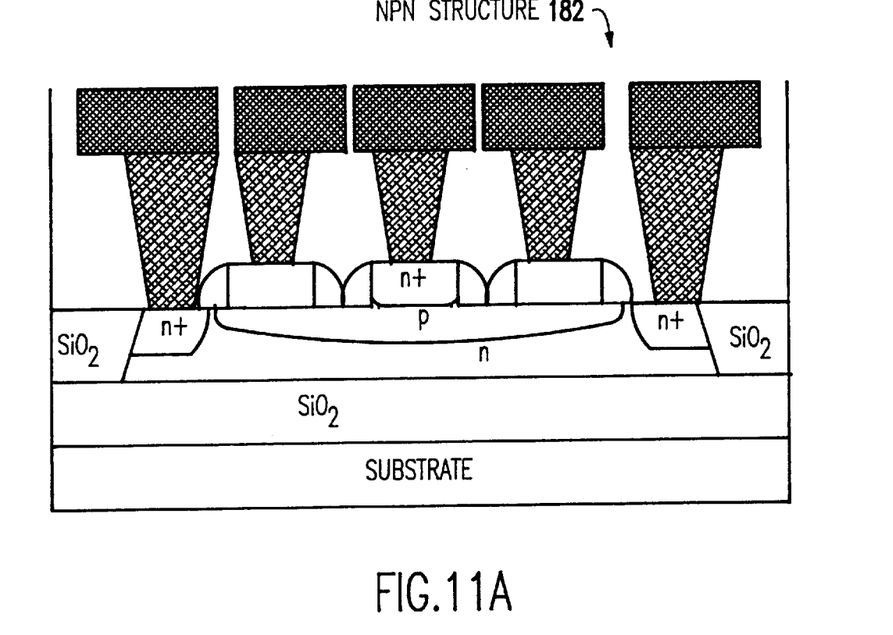
FIGS. 11a–b are cross-sectional views of bipolar transistors produced according to the present invention.
Figure 11B:
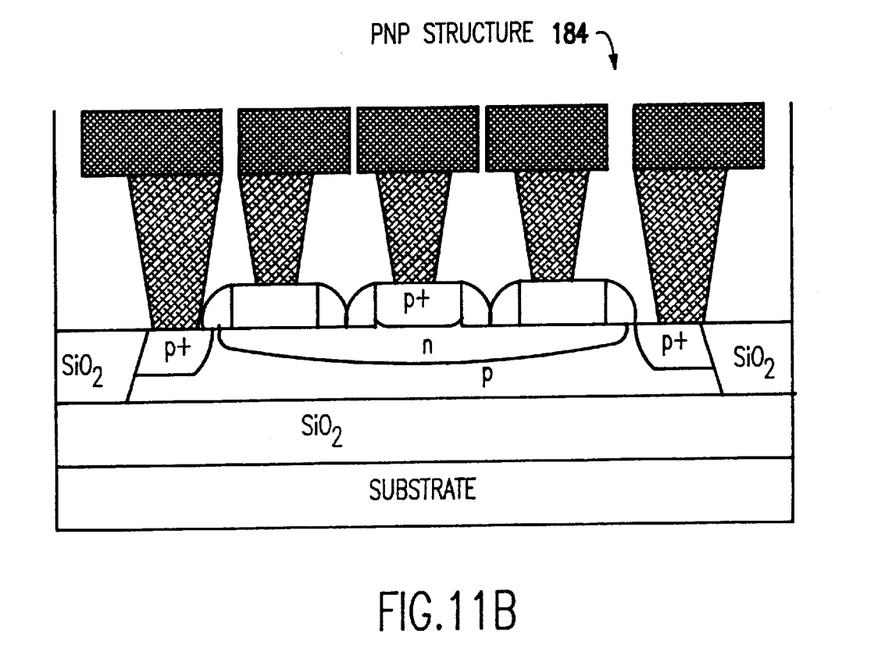
Figure 12:
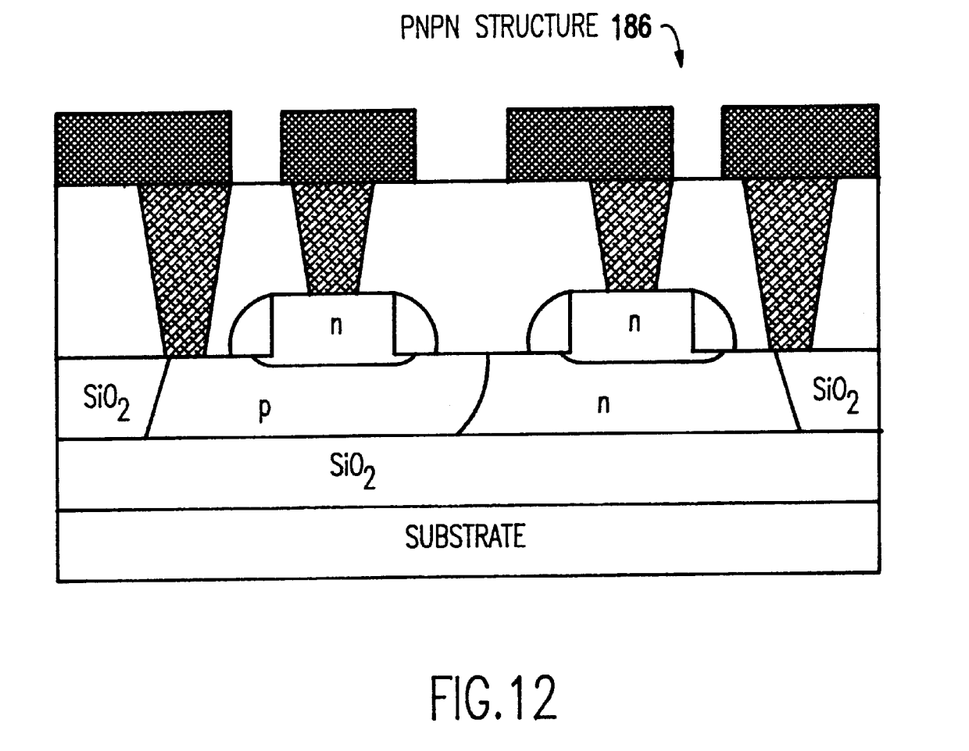
FIG. 12 is a cross-sectional view of a pnpn silicon controlled rectifier (SCR) structure produced according to the present invention.

FIG. 10 shows an isolation defined diode, FIG. 11a shows an NPN structure 182, FIG. 11b shows a PNP structure 184, and FIG. 12 shows a PNPN device 186, all of which are constructed in the dual silicon film of this invention. For the diode shown in FIG. 10, the dopant of the source/drain anode is of the opposite polarity of the body cathode. The diode metallurgical junction depth can remain in the first silicon film, or extend into the second film. This is dependent on the isolation depth that defines the diode anode implant. For the bipolar transistors shown in FIGS. 11a and 11b, the dopant of the emitter and base is of the opposite polarity and the emitter is of the same dopant type as the collector. The diode metallurgical junction depth can remain in the first silicon film, or extend to the second film. FIG. 12 shows the construction of a pnpn in the dual film section of this invention. The pnpn structure 186 can replace the pnp with a dual film PFET or the npn with a dual film NFET. Replacement of the SCR with a transistor is also known as a low voltage trigger SCR (LVTSCR).

The robust elements described above can serve as elements in analog applications such as phase-lock loop (PLL) circuits, driver and receiver circuits, and ESD networks used in CMOS circuitry.

While the invention has been described in terms of its preferred embodiments, those of skill in the art will recognize that the invention can be practiced with modification within the scope of the appended claims.

What is claimed is:

1. A method for fabricating a silicon-on-insulator device, comprising the steps of:

isolating regions of surface silicon of a substrate comprised of bulk silicon and surface silicon separated by an insulator to produce at least first and second regions of surface silicon separated by an isolation region having a top surface that is substantially coplanar with a top surface of said at least first and second regions and which extends to said insulator;

applying a mask pattern to a surface of said substrate, said mask pattern having openings which expose at least one of said first region, said second region, and said isolation region;

adding a second silicon layer to said substrate at openings defined in said mask pattern;

removing said mask pattern; and forming a first electronic device in said second silicon layer.

2. The method of claim 1 further comprising the step of selectively doping at least one of said first and second regions of surface silicon with an ion.

3. The method of claim 1 further comprising the step of forming a second electronic device in at least one of said first and second regions of surface silicon.

4. The method of claim 1 wherein said step of adding includes the step of depositing crystalline silicon in said openings.

5. The method of claim 1 wherein said step of adding includes the step of growing crystalline silicon in said openings.

6. The method of claim 1 wherein said step of adding includes the steps of depositing polysilicon over said substrate to fill said openings, and planarizing said polysilicon.

7. The method as recited in claim 1, further comprising the step of forming sidewall insulation on a vertical edge of the second silicon layer.

8. The method as recited in claim 1, wherein the isolation region is comprised of $SiO_2$.

9. The method as recited in claim 1, wherein the isolation region is a trench isolation.

10. The method as recited in claim 1, wherein the isolation region is a MESA isolation.

* * * * *